(12) United States Patent
Hsieh et al.

(10) Patent No.: US 11,258,365 B2
(45) Date of Patent: Feb. 22, 2022

(54) POWER CONVERTER

(71) Applicant: ANPEC ELECTRONICS CORPORATION, Hsinchu (TW)

(72) Inventors: Jen-Chien Hsieh, Hsinchu (TW); Tsung-Yu Wu, Hsinchu (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 16/910,425

(22) Filed: Jun. 24, 2020

(65) Prior Publication Data
US 2021/0305899 A1    Sep. 30, 2021

(30) Foreign Application Priority Data
Mar. 30, 2020    (TW) .................... 109110743

(51) Int. Cl.
| | |
|---|---|
| H02M 3/158 | (2006.01) |
| G05F 3/26 | (2006.01) |
| G05F 1/46 | (2006.01) |
| G01R 19/165 | (2006.01) |
| G01R 19/175 | (2006.01) |
| H03K 5/24 | (2006.01) |
| H02M 1/00 | (2006.01) |

(52) U.S. Cl.
CPC .... *H02M 3/1584* (2013.01); *G01R 19/16528* (2013.01); *G01R 19/175* (2013.01); *G05F 1/461* (2013.01); *G05F 3/262* (2013.01); *H03K 5/24* (2013.01); *H02M 1/0009* (2021.05); *H02M 1/0025* (2021.05)

(58) Field of Classification Search
USPC ................................................ 323/269–289
See application file for complete search history.

(56) References Cited

U.S. PATENT DOCUMENTS

| | | | |
|---|---|---|---|
| 9,270,176 B1* | 2/2016 | Nguyen | H02M 3/156 |
| 2007/0182392 A1* | 8/2007 | Nishida | H02M 3/156 |
| | | | 323/282 |

(Continued)

FOREIGN PATENT DOCUMENTS

| | | |
|---|---|---|
| TW | 201913270 A | 4/2019 |
| TW | 201929401 A | 7/2019 |

*Primary Examiner* — Kevin J Comber
*Assistant Examiner* — Nusrat Quddus
(74) *Attorney, Agent, or Firm* — Li & Cai Intellectual Property (USA) Office (57) ABSTRACT

A power converter is provided. A driver circuit is connected between a controller circuit and a switch circuit. The switch circuit is connected to an inductor. The inductor is connected in series with a first capacitor and grounded through the first capacitor. A first comparison input terminal of a first comparator is connected to an output terminal between the inductor and the first capacitor. A second comparison input terminal of the first comparator is grounded through a second capacitor. The controller circuit outputs a control signal for controlling the driver circuit to drive the switch circuit according to a comparison signal outputted by the first comparator. A reference current source provides a reference current to the second capacitor. A first terminal of a first resistor is connected to the second capacitor. A second terminal of the first resistor is coupled to a reference potential.

9 Claims, 5 Drawing Sheets

(56) References Cited

U.S. PATENT DOCUMENTS

| | | | | |
|---|---|---|---|---|
| 2009/0140708 A1* | 6/2009 | Tateishi | ............. | H02M 3/1588 |
| | | | | 323/282 |
| 2009/0243580 A1* | 10/2009 | Chen | .................... | H02M 3/156 |
| | | | | 323/288 |
| 2009/0322299 A1* | 12/2009 | Michishita | ............ | H02M 3/156 |
| | | | | 323/282 |
| 2013/0147454 A1* | 6/2013 | Wang | .................. | H02M 3/1588 |
| | | | | 323/283 |
| 2017/0163150 A1* | 6/2017 | Xi | ....................... | H02M 3/1588 |
| 2020/0403497 A1* | 12/2020 | Scappatura | ......... | H02M 1/4225 |

* cited by examiner

POWER CONVERTER

CROSS-REFERENCE TO RELATED PATENT APPLICATION

This application claims the benefit of priority to Taiwan Patent Application No. 109110743, filed on Mar. 30, 2020. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a power converter, and more particularly to a power converter that can converge a waveform of a current of an inductor without using an equivalent series resistor (ESR).

BACKGROUND OF THE DISCLOSURE

When a conventional power converter such as a DC-DC converter is connected to a light load that requires less energy, an upper bridge switch and a lower bridge switch of the conventional power converter are switched at a low frequency. An audio frequency of noise generated by an inductor and a capacitor of the conventional power converter may fall within a human hearing range of 2 KHZ to 20 KHZ.

Figure 5:
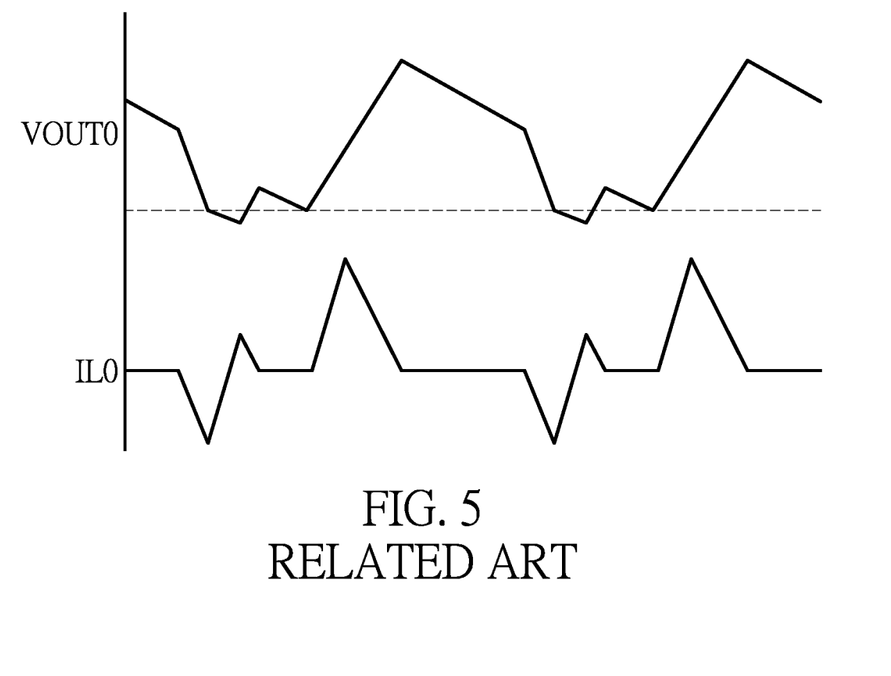
FIG. 5 is a waveform diagram of signals of a conventional power converter in which an equivalent series resistor is not disposed.

In order to prevent the noise from being heard by a human, the upper bridge switch is turned off and the lower bridge switch is turned on in the conventional power converter to pull down an output voltage VOUT0 of the conventional power converter as shown in FIG. 5. When the output voltage VOUT0 of the conventional power converter is lower than a reference voltage, the upper bridge switch is turned on and the lower bridge switch is turned off to charge the output voltage VOUT0 of the conventional power converter such that the output voltage VOUT0 has sufficient energy. When a current of the inductor of the conventional power converter reaches zero, the upper bridge switch and the lower bridge switch are turned off. That is, a switching frequency of the upper bridge switch and the lower bridge switch increases by turning on the upper bridge switch early, such that the audio frequency of the noise does not fall within the human hearing range.

It should be understood that, if an equivalent series resistor is not disposed in the conventional power converter, the conventional power converter has a non-ideal delay characteristic that the energy of the output voltage VOUT0 is dispersed and cannot be balanced in one cycle of a signal of the current of the inductor when the output voltage VOUT0 is pulled down. As shown in FIG. 5, when the output voltage VOUT0 of the conventional power converter is pulled down excessively within a constant time of one cycle of a signal of a current ILO of the inductor, energy of a waveform formed in a negative half cycle of the signal is higher than energy of a waveform formed in a positive half cycle of the signal. Therefore, the equivalent series resistor must be disposed in the conventional power converter. When the equivalent series resistor is disposed and the current ILO having a negative current value flows through the inductor, a ripple of the output voltage VOUT0 increases and the output voltage VOUT0 decreases more, such that an on-time of the lower bridge switch of the conventional power converter is shortened.

With the development of technology, in order to improve the flexibility of the circuit design, a multi-layer ceramic capacitor (MLCC) is disposed in the conventional power converter. However, a resistance of an equivalent series resistor of the multi-layer ceramic capacitor approaches zero, resulting in energy imbalance. As a result, the energy of the conventional power converter is insufficient to be exchanged between an ultrasonic working mode (USM) and a pulse frequency modulation mode (PFM). When the conventional power converter enters the ultrasonic working mode, a ripple of the output voltage VOUT0 increases, and a switching frequency of the upper bridge switch and the lower bridge switch is equal to an ultrasonic frequency.

SUMMARY OF THE DISCLOSURE

In response to the above-referenced technical inadequacies, the present disclosure provides a power converter having a switch circuit, a controller circuit and a driver circuit. The driver circuit is connected between the controller circuit and the switch circuit. The controller circuit outputs a control signal for controlling the driver circuit to drive the switch circuit according to a first comparison signal. The switch circuit is connected to an input voltage source and an inductor. The inductor is connected in series with a first capacitor and grounded through the first capacitor. The power converter includes a first comparator and a reference voltage supplying circuit. The first comparator has a first comparison input terminal and a second comparison input terminal. The first comparison input terminal is connected to an output terminal between the inductor and the first capacitor. The first comparator is configured to compare a voltage of the first comparison input terminal with a target reference voltage of the second comparison input terminal to output the first comparison signal to the controller circuit. The reference voltage supplying circuit includes a second capacitor, a reference current source and a first resistor. The second capacitor has a first terminal connected to the second comparison input terminal of the first comparator, and has a second terminal grounded. The reference current source is connected to the first terminal of the second capacitor. The reference current source is configured to provide a reference current to the second capacitor to charge the second capacitor such that the second capacitor has the target reference voltage. The first resistor has a first terminal connected to the first terminal of the second capacitor, and has a second terminal coupled to a first reference level.

In certain embodiments, the power converter further includes a voltage divider circuit. The voltage divider circuit is connected between the output terminal and the first comparison input terminal. The voltage divider circuit is configured to divide an output voltage of the output terminal to output a divided voltage to the first comparison input terminal.

In certain embodiments, the reference voltage supplying circuit further includes a second resistor. A first terminal of the second resistor is connected to the second terminal of the first resistor. The first reference level is at a first reference node between the first resistor and the second resistor.

In certain embodiments, the reference voltage supplying circuit further includes a current mirror connected to a common voltage source and the first reference node.

In certain embodiments, the current mirror includes a first transistor and a second transistor. A first terminal of the first transistor and a first terminal of the second transistor are connected to the common voltage source. A second terminal of the first transistor is connected to the first reference node. A control terminal of the first transistor is connected to a control terminal and a second terminal of the second transistor. The second terminal of the second transistor is grounded.

In certain embodiments, the reference voltage supplying circuit further includes a third resistor. The second terminal of the second transistor is grounded through the third resistor.

In certain embodiments, the reference voltage supplying circuit further includes a third transistor connected between the second transistor and the third resistor. A first terminal of the third transistor is connected to the second terminal of the second transistor. A second terminal of the third transistor is grounded through the third resistor. A control terminal of the third transistor is coupled to a first control level.

In certain embodiments, the reference voltage supplying circuit further includes a third capacitor. A first terminal of the third capacitor is connected to the control terminal of the third transistor. A second terminal of the third capacitor is grounded. The third capacitor has the first control level.

In certain embodiments, the reference voltage supplying circuit further includes an operational amplifier having a first amplification input terminal and a second amplification input terminal. The first amplification input terminal of the operational amplifier is coupled to a second reference level. The second amplification input terminal of the operational amplifier is connected to a second node between the third transistor and the third resistor. An output terminal of the operational amplifier is connected to the first terminal of the third capacitor.

In certain embodiments, the reference voltage supplying circuit further includes a fourth transistor connected between the reference current source and the second capacitor. A first terminal of the fourth transistor is connected to the reference current source. A second terminal of the fourth transistor is connected to the first terminal of the second capacitor. A control terminal of the fourth transistor is coupled to a second control potential.

In certain embodiments, the power converter further includes a mode switching circuit. The mode switching circuit is connected to an output terminal of the first comparator and the control terminal of the fourth transistor. The mode switching circuit is configured to output a mode switching signal to the control terminal of the fourth transistor according to the first comparison signal.

In certain embodiments, the power converter further includes a logic circuit. An input terminal of the logic circuit is connected to the output terminal of the first comparator, an output terminal of the mode switching circuit and an input terminal of the controller circuit. The logic circuit is configured to output a logic signal to the controller circuit according to the first comparison signal and the mode switching signal.

In certain embodiments, the power converter further includes an on-time adjuster circuit. The on-time adjuster circuit is connected to the logic circuit, the switch circuit and the input voltage source. The on-time adjuster circuit is configured to receive an input voltage from the input voltage source and output an on-time signal according to an on state of the switch circuit. The logic circuit outputs the logic signal according to the first comparison signal, the mode switching signal and the on-time signal.

In certain embodiments, the power converter further includes a logic gate. Two input terminals of the logic gate are respectively connected to the output terminal of the mode switching circuit and an output terminal of the on-time adjuster circuit. An output terminal of the logic gate is connected to the input terminal of the logic circuit.

In certain embodiments, the power converter further includes a zero current detector circuit. The zero current detector circuit is connected to the switch circuit, the controller circuit, the on-time adjuster circuit and the mode switching circuit. The zero current detector circuit is configured to detect a current flowing through the switch circuit to output a current value. The on-time signal, the mode switching signal and the control signal depend on the current value.

In summary, the present disclosure provides the power converter such as a constant on-time power converter. The waveform of the current of the inductor of the power converter of the present disclosure can be converged without using the equivalent series resistor of the conventional power converter to enhance the design flexibility of the system.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 1:
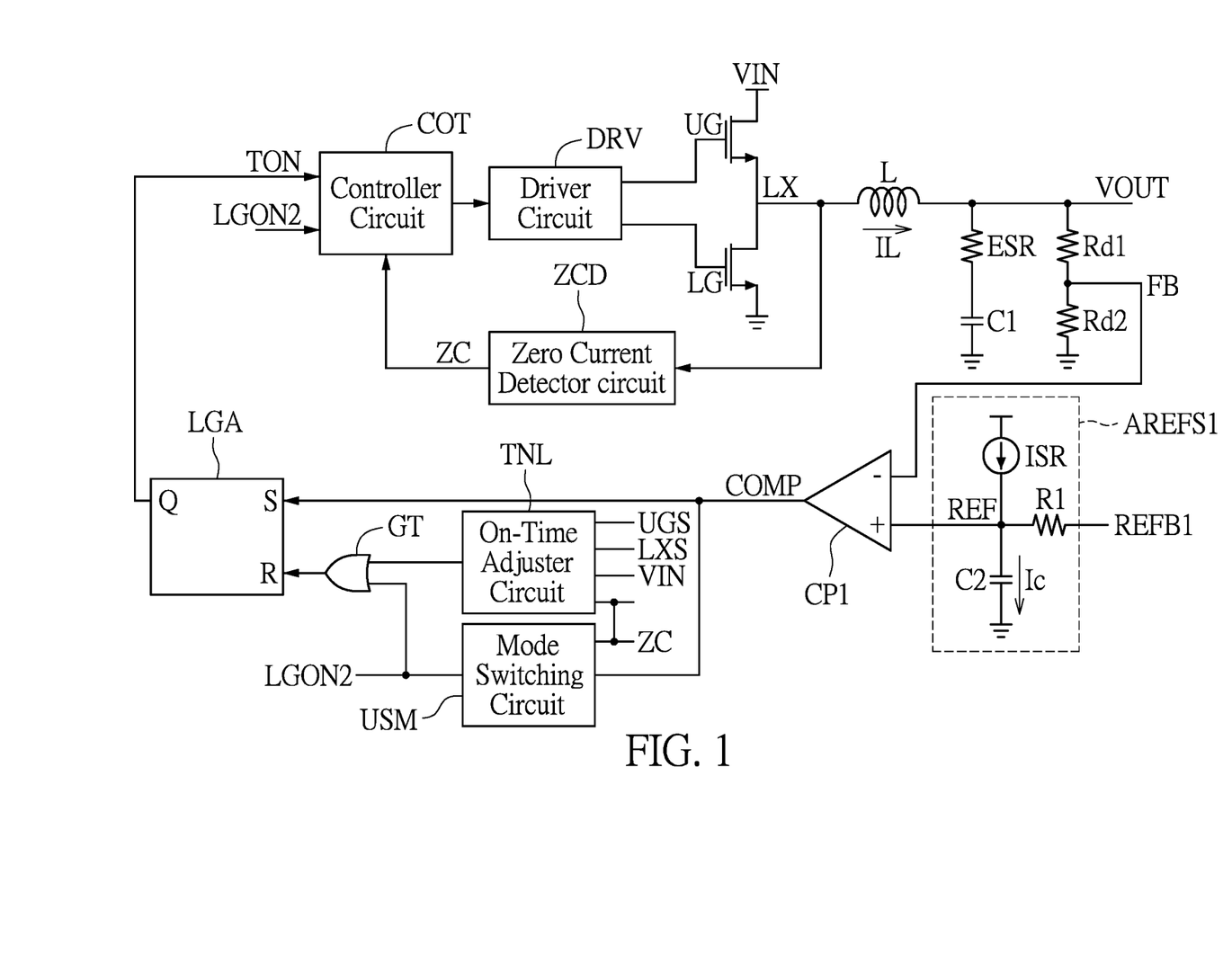
FIG. 1 is a circuit layout diagram of a power converter according to a first embodiment of the present disclosure.

Reference is made to FIG. 1, which is a circuit layout diagram of a power converter according to a first embodiment of the present disclosure. As shown in FIG. 1, in the embodiment, the power converter such as a buck converter may include a controller circuit COT, a driver circuit DRV, a first comparator CP1 and a switch circuit. The switch circuit includes an upper bridge switch UG and a lower bridge switch LG.

The driver circuit DRV is connected between the controller circuit COT and the switch circuit. In detail, a control terminal of the upper bridge switch UG and a control terminal of the lower bridge switch LG are connected to the driver circuit DRV. A first terminal of the upper bridge switch UG of the switch circuit is connected to an input voltage source, and receives an input voltage VIN from the input voltage source. A node LX between the upper bridge switch UG and the lower bridge switch LG is connected to a first terminal of an inductor L. A second terminal of the inductor L is connected to a first terminal of a first capacitor C1. A second terminal of the first capacitor C1 is grounded. In brief, the inductor L is connected in series with the first capacitor C1 and grounded through the first capacitor C1. The first capacitor C1 is used to stabilize an output voltage of the power converter.

It is worth noting that, in order to improve a design flexibility of a system, in the embodiment, a resistance of an equivalent series resistor ESR of the power converter as shown in FIG. 1 is equal to or approaches zero, or the equivalent series resistor ESR is not disposed in the power converter. In the embodiment, the power converter further includes a reference voltage supplying circuit AREFS1 used for converging a waveform of a current IL of the inductor L (in ultrasonic working mode), an effect of which is achieved by the equivalent series resistor in the conventional power converter. The reference voltage supplying circuit AREFS1 includes a reference current source ISR, a second capacitor C2 and a first resistor R1.

A first terminal of the first resistor R1 is connected to a first terminal of the second capacitor C2. A second terminal of the first resistor R1 is coupled to a first reference level REFB1. The reference current source ISR is connected to the first terminal of the second capacitor C2. The reference current source ISR is configured to provide a reference current Ic to the second capacitor C2 to charge the second capacitor C2 to have a target reference voltage REF. It should be understood that the target reference voltage REF changes with the reference current Ic provided by the reference current source ISR.

The first comparator CP1 has a first comparison input terminal such as an inverting input terminal, and a second comparison input terminal such as a non-inverting input terminal. The second comparison input terminal of the first comparator CP1 is connected to the reference voltage supplying circuit AREFS1 and receives the target reference voltage REF from the reference voltage supply circuit AREFS1.

In detail, the first terminal of the second capacitor C2 is connected to the second comparison input terminal of the first comparator CP1. A second terminal of the second capacitor C2 is grounded. A voltage of the second comparison input terminal of the first comparator CP1 is equal to a voltage of the second capacitor C2 that is the target reference voltage REF. The first comparison input terminal of the first comparator CP1 is connected to an output terminal between the inductor L and the first capacitor C1 that is the output terminal of the power converter. The first comparison input terminal of the first comparator CP1 obtains an output voltage VOUT of the power converter.

If necessary, in the embodiment, the power converter may further include a voltage divider circuit. The voltage divider circuit is connected between an output terminal LX of the switch circuit and the first comparison input terminal of the first comparator CP1. The voltage divider circuit may include a first voltage division resistor Rd1 and a second voltage division resistor Rd2. The first comparison input terminal of the first comparator CP1 is connected to a feedback node between the first voltage division resistor Rd1 and the second voltage division resistor Rd2. The voltage divider circuit is configured to divide the output voltage VOUT of the output terminal to generate a divided voltage FB at the feedback node. The divided voltage FB is inputted to the first comparison input terminal of the first comparator CP1.

The first comparator CP1 is configured to compare a voltage of the first comparison input terminal (that is the output voltage VOUT or the divided voltage FB thereof) with a voltage of the second comparison input terminal (that is the target reference voltage REF) to output a first comparison signal COMP to the controller circuit COT.

For example, the first comparison input terminal of the first comparator CP1 is the inverting input terminal, and the second comparison input terminal of the first comparator CP1 is the non-inverting input terminal. The output terminal of the power converter is connected to a load. That is, the load is connected to a node between the inductor L and the first voltage division resistor Rd1. Under this condition, when the load continuously obtains energy from the power converter, the output voltage VOUT and the divided voltage FB of the power converter gradually reduce. When the divided voltage FB (which is replaced with the output voltage VOUT if the voltage divider circuit is not disposed) is lower than the target reference voltage REF, the first comparator CP1 outputs the first comparison signal COMP at a high level.

It should be understood by those skilled in the art that, the circuit components described in the embodiment can be removed from the power converter or new circuit components can be appropriately disposed in the power converter according to actual application requirements, the present disclosure is not limited thereto.

In the embodiment, the power converter may include a logic circuit LGA. One input terminal of the logic circuit LGA is connected to an output terminal of the first comparator CP1. The logic circuit LGA is configured to output a logic signal TON to the controller circuit COT according to the first comparison signal COMP of the first comparator CP1. The controller circuit COT outputs a control signal for controlling the driver circuit DRV to drive the upper bridge switch UG and the lower bridge switch LG of the switch circuit according to the logic signal TON.

If the power converter needs to be accurately switched between different modes such as an ultrasonic working mode (USM) and a pulse frequency modulation mode (PFM), the power converter in the embodiment of the present disclosure may further include a mode switching circuit USM. The mode switching circuit USM may be connected to the output terminal of the first comparator CP1.

In the above-mentioned configuration, the mode switching circuit USM may output a mode switching signal LGON2 according to the first comparison signal COMP of the first comparator CP1. The logic circuit LGA may output the logic signal TON according to the first comparison signal COMP and the mode switching signal LGON2. The controller circuit COT may output the control signal to the driver circuit DRV to control the driver circuit DRV to drive the upper bridge switch UG and the lower bridge switch LG, according to the logic signal TON and the mode switching signal LGON2.

It should be understood that, when the upper bridge switch UG is turned on and the lower bridge switch LG is turned off, the input voltage VIN provides energy to the inductor L and the output voltage VOUT is continuously charged by the current IL of the inductor L. When the energy of the output voltage VOUT is sufficient, the upper bridge switch UG is turned off and the lower bridge switch LG is turned on. At this time, the residual energy of the current IL of the inductor L is supplied to the output voltage VOUT.

In order to control an on-time of the upper bridge switch UG and an on-time of the lower-bridge switch LG of the switch circuit as desired, in the embodiment, the power converter may further include an on-time adjuster circuit TNL. The on-time adjuster circuit TNL is connected to the logic circuit LGA, the upper bridge switch UG of the switch circuit, the lower bridge switch LG of the switch circuit, and the input voltage source for supplying the input voltage VIN.

In the above-mentioned configuration, the on-time adjuster circuit TNL may receive the input voltage VIN from the input voltage source and output an on-time signal according to an on state of the switch circuit. For example, the on-time adjuster circuit TNL may output the on-time signal according to an upper bridge conduction signal UGS for controlling the upper bridge switch UG, a voltage signal LXS of the node LX and the input voltage VIN. The logic circuit LGA may output the logic signal TON according to the first comparison signal COMP, the on-time signal and the mode switching signal LGON2.

If necessary, in the embodiment, the power converter may further include a logic gate GT such as an OR gate, but the present disclosure is not limited thereto. In practice, the OR gate may be replaced with other types of logic gates. Two input terminals of the logic gate GT are respectively connected to an output terminal of the mode switching circuit USM and an output terminal of the on-time adjuster circuit TNL. An output terminal of the logic gate GT is connected to another input terminal of the logic circuit LGA.

In the above-mentioned configuration, the logic gate GT is configured to output a logic gate signal according to the on-time signal of the on-time adjuster circuit TNL and the mode switching signal LGON2 of the mode switching circuit USM. The logic circuit LGA may output the logic signal TON according to the first comparison signal COMP and the logic gate signal.

For example, the logic circuit LGA may be an SR flip-flop, but the present disclosure is not limited thereto. A first input terminal S of the SR flip-flop may be connected to the output terminal of the first comparator CP1 and receive the first comparison signal COMP from the first comparator CP1. A second input terminal R of the SR flip-flop may be connected to the output terminal of the logic gate GT and receive the logic gate signal from the logic gate GT. An output terminal Q of the SR flip-flop is connected to an input terminal of the controller circuit COT and outputs the logic signal TON to the controller circuit COT.

When the first comparator CP1 outputs the first comparison signal COMP at the high level as described above, it means that the energy of the output voltage VOUT or the divided voltage FB is insufficient. At this time, the SR flip-flop is triggered to perform a SET operation by the first comparison signal COMP at the high level. The output terminal Q of the SR flip-flop outputs the logic signal at a high level according to the first comparison signal COMP at the high level. The controller circuit COT controls the driver circuit DRV to turn on the upper bridge switch UG according to the logic signal at the high level. After the upper bridge switch UG is turned on, the input voltage VIN provides energy to the output voltage VOUT.

Further, in the embodiment, the power converter may further include a zero current detector circuit ZCD or other current detector circuits. The zero current detector circuit ZCD is connected to the node LX between the upper bridge switch UG and the lower bridge switch LG of the switch circuit, the controller circuit COT, the on-time adjuster circuit TNL and the mode switching circuit USM.

When the load obtains sufficient energy, the upper bridge switch UG is turned off and the lower bridge switch LG is turned on such that the current IL that provides energy to the load gradually approaches zero. When the lower bridge switch LG is turned on and the divided voltage FB or output voltage VOUT is higher than the target reference voltage REF, energy is not required for the output voltage VOUT.

The zero current detector circuit ZCD is configured to detect the current IL of the inductor L. When the zero current detector circuit ZCD detects that the current IL of the inductor L reaches zero, the zero current detector circuit ZCD outputs a zero current detected signal ZC to the controller circuit COT. The controller circuit COT controls the driver circuit DRV to turn off the lower bridge switch LG according to the zero current detected signal ZC. At this time, the upper bridge switch UG and the lower bridge switch LG are in an off state.

In the above-mentioned configuration, the on-time adjuster circuit TNL may output the on-time signal, according to the zero current detected signal ZC of the zero current detector circuit ZCD, the upper bridge conduction signal UGS, the voltage signal LXS of the node LX and the input voltage VIN. The mode switching circuit USM may output the mode switching signal LGON2 according to the zero current detected signal ZC and the first comparison signal COMP.

Figure 2:
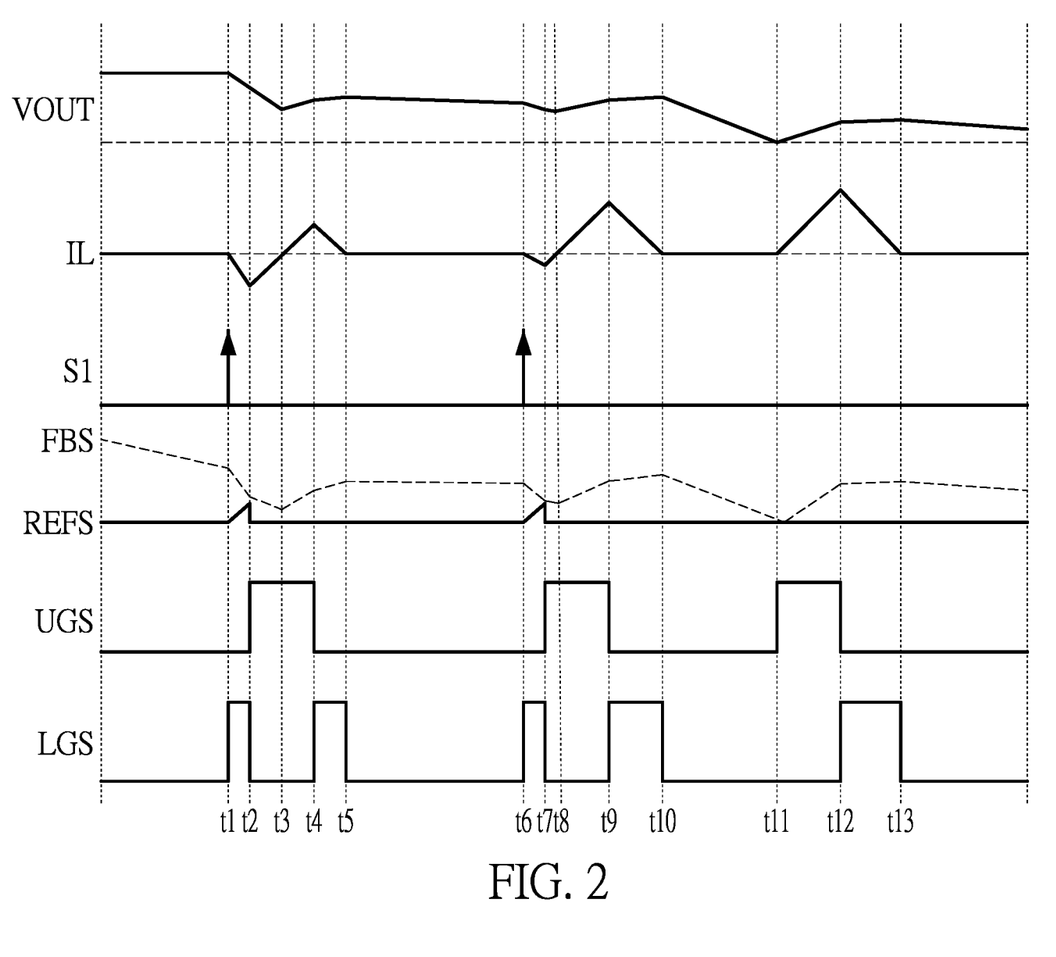
FIG. 2 is a waveform diagram of signals of the power converter according to embodiments of the present disclosure.

Reference is made to FIGS. 1 and 2, wherein FIG. 1 is a circuit layout diagram of a power converter according to a first embodiment of the present disclosure, and FIG. 2 is a waveform diagram of signals of the power converter according to embodiments of the present disclosure.

The load is an extremely light load during a time interval between a time point t1 to a time point t2 as shown in FIG. 2. The upper bridge conduction signal UGS at a low level as shown in FIG. 2 indicates that the upper bridge switch UG shown in FIG. 1 is not turned on for a period of time such as 33 us. Under this condition, a lower bridge conduction signal LGS at a high level as shown in FIG. 2 indicates that the lower bridge switch LG is turned on at the time point t1.

When the lower bridge switch LG is turned on, the target reference voltage REF of a target reference voltage signal REFS is raised from the time point t1 indicated by a raising indication signal S1 as shown in FIG. 2. A slope of the target reference voltage REF continuously increases to simulate a ripple of an equivalent series resistor to suppress the current IL of the inductor L from pulling down excessively, thereby converging the waveform of the current IL of the inductor L, the effect of which is achieved by the equivalent series resistor in the conventional power converter.

As a result, a divided voltage of a divided voltage signal FBS of the power converter reaches the target reference voltage REF of the target reference voltage signal REFS at the time point t2 to trigger the first comparator CP1 to output the first comparison signal COMP at a high level. The controller circuit COT controls the driver circuit DRV to turn off the lower bridge switch LG and turn on the upper bridge switch UG during a time interval between the time point t2 to a time point t4, according to the first comparison signal COMP at the high level. At this time, the input voltage VIN provides energy to the inductor L, and the output voltage VOUT is charged by the current IL of the inductor L such that the output voltage VOUT and the divided voltage FB gradually increase.

The current IL of the inductor L is multiplied by a resistance of the equivalent series resistor ESR to obtain a product value. When the power converter uses the equivalent series resistor ESR, the output voltage VOUT of the power converter is equal to a value obtained by subtracting the product value from a voltage of the capacitor C1. This process is represented by the following equation: VOUT=VO-IL×ESR, wherein VOUT represents the output voltage of the power converter, VO represents the voltage of the first capacitor C1, IL represents the current of the inductor L, and ESR represents the resistance of the equivalent series resistance ESR.

It can be observed from the equation below that, when a rising slope of the divided voltage FB increases, which is equivalent to increasing the resistance of the equivalent series resistor ESR, the divided voltage FB or the output voltage VOUT of the power converter can reach the target reference voltage REF earlier. As a result, the on-time of the lower bridge switch LG can be shortened such that non-ideal delay of the power converter can be improved, thereby converging the waveform of the current IL of the inductor L, the effect of which is achieved by the equivalent series resistor in the conventional power converter.

$$\Delta Vout = \Delta I(t) \cdot ESR = \frac{Vout \cdot \Delta t_{LGON}}{L} \cdot ESR,$$

$$\frac{\Delta Vjb}{\Delta t_{LGON}} = \frac{Vout}{L} \cdot ESR \cdot \frac{R_{gnd}}{R_{top} + R_{gnd}},$$

wherein $\Delta Vout$ represents the amount of change in the output voltage VOUT of the power converter, $\Delta I(t)$ represents the amount of change in the current IL of the inductor L, ESR represents the resistance of the equivalent series resistor ESR, VOUT represents the output voltage of the power converter, $\Delta t_{LGON}$ represents the on-time of the lower bridge switch LG, L represents an inductance of the inductor L, $\Delta Vfb$ represents the amount of change in the divided voltage FB of the output voltage VOUT of the power converter, $R_{top}$ represents a resistance of the first voltage division resistor Rd1, and $R_{gnd}$ represents a resistance of the second voltage division resistor Rd2.

In the embodiment, a capacitance of the second capacitor C2 shown in FIG. 1 and a value of a reference current Ic supplied to the second capacitor C2 by the reference current source ISR can be set and adjusted to determine the amount of increase in the target reference voltage REF, which is represented by the following equation:

$$\frac{\Delta Vref}{\Delta t_{LGON}} = \frac{I_C}{C},$$

wherein $\Delta Vref$ represents the amount of change in the target reference voltage REF, $\Delta t_{LGON}$ represents the on-time of the lower bridge switch LG, $I_C$ represents a value of a current of the second capacitor C2, and C represents the capacitance of the second capacitor C2.

The upper bridge switch UG is turned off and the lower bridge switch LG is turned on during the time interval from the time point t4 to a time point t5. After the residual energy of the current IL of the inductor L is supplied to the output voltage VOUT, the current IL of the inductor L detected by the zero current detector circuit ZCD reaches zero. Under this condition, the zero current detector circuit ZCD outputs the zero current detected signal ZC to the control circuit COT. The control circuit COT controls the drive circuit DRV to turn off the lower bridge switch LG according to the zero current detected signal ZC. As a result, the upper bridge switch UG and the lower bridge switch LG are in an off state.

In the embodiments of the present disclosure, in order to enhance design flexibility of circuit configuration, the resistance of the equivalent series resistor ESR of the power converter is equal to or approaches zero. Alternatively, any equivalent series resistor is not disposed in the power converter. Under this condition, as shown in FIG. 2, energy in a positive half cycle of a first waveform of the current IL of the inductor L of the power converter is equal to energy in a negative half cycle of the first waveform of the current IL. That is, the energy in the positive half cycle and the energy in the negative half cycle are balanced in one cycle of the current IL of the inductor L. As a result, the first waveform of the current IL is converged.

The load is a light load during a time interval between a time point t6 to a time point t7. After a period of time such as 33 us has elapsed from the time point t5, the target reference voltage REF of the target reference voltage signal REFS starts to rise from the time point t6 indicated by the raising indication signal S1 as shown in FIG. 2. A resistance of the load from the time point t6 to the time point t7 is larger than that from the time point t1 to the time point t2. As a result, a time required for pulling down the output voltage VOUT is shorter such that the lower bridge switch LG can be turned off earlier.

The input voltage VIN continues to supply energy to the output voltage VOUT during a time interval between the time point t7 to a time point t9, that is, during a working period of the upper bridge conduction signal UGS (i.e. the on-time of the upper bridge switch UG). After the on-time of the upper bridge switch UG has elapsed, the input voltage VIN stops supplying the energy to the output voltage VOUT.

The zero current detector circuit ZCD detects the current IL of the inductor L during a time interval between the time point t9 to a time point t10. The zero current detector circuit ZCD detects that the current IL of the inductor L reaches zero at the time point t10, the zero current detector circuit ZCD outputs the zero current detected signal ZC to the control circuit COT. The control circuit COT controls the driving circuit DRV to turn off the lower bridge switch LG according to the zero current detected signal ZC.

The above-mentioned load is a slight heavy load during a time interval between a time point t11 to a time point t12. When the output voltage VOUT of the power converter does not have sufficient energy during the time interval, the upper bridge switch UG is turned on. As a result, the output voltage VOUT of the power converter has the sufficient energy during a time interval between the time point t12 to a time point t13. At this time, the upper bridge switch UG is turned off and the lower bridge switch LG is turned on. When the zero current detector circuit ZCD detects that the current IL of the inductor L reaches zero at the time point T13, the zero current detector circuit ZCD outputs the zero current detected signal ZC, and the control circuit COT accordingly controls the driving circuit DRV to turn off the lower bridge switch LG.

Figure 3:
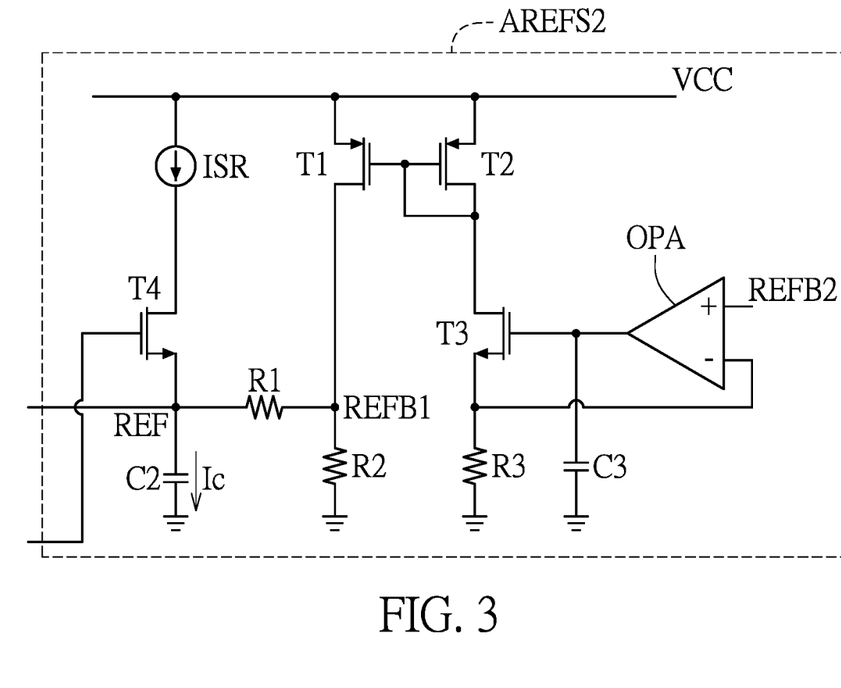
FIG. 3 is a circuit layout diagram of a reference voltage supplying circuit of a power converter according to a second embodiment of the present disclosure.
Figure 4:
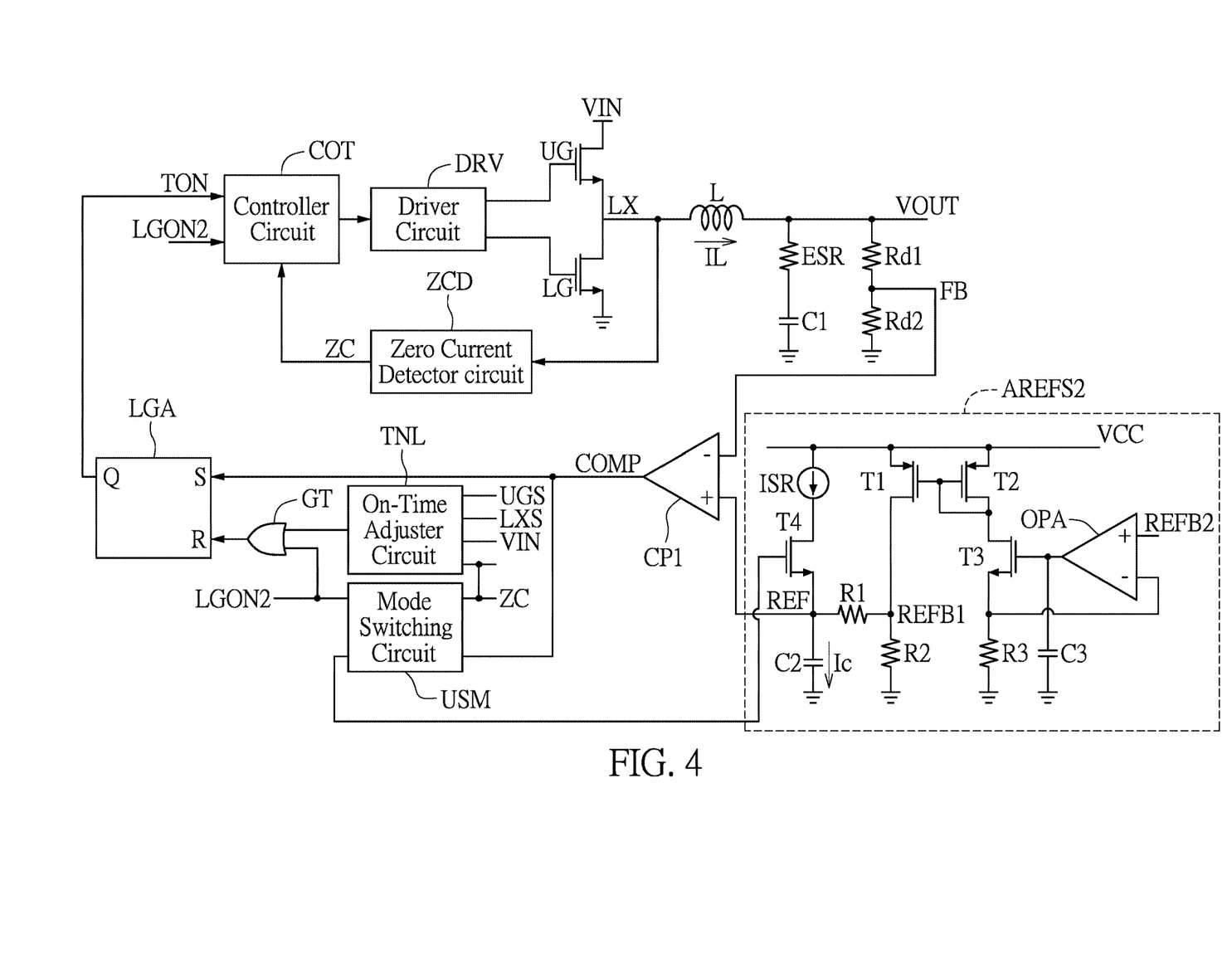
FIG. 4 is a circuit layout diagram of the power converter according to the second embodiment of the present disclosure.

Reference is made to FIGS. 3 and 4, wherein FIG. 3 is a circuit layout diagram of a reference voltage supplying circuit of a power converter according to a second embodiment of the present disclosure, and FIG. 4 is a circuit layout diagram of the power converter according to the second embodiment of the present disclosure.

Differences between the power converters of the first and second embodiments are that, circuit components and configurations of the reference voltage supply circuit AREF1 shown in FIG. 1 are different from that of a reference voltage supply circuit AREF2 shown in FIGS. 3 and 4. The effect of converging the waveform also can be achieved by the power converter in the second embodiment. The same descriptions of the first and second embodiments are not repeated here.

As shown in FIG. 3, the reference voltage supply circuit AREF2 may include all or some of the following circuit components: the second capacitor C2, the reference current source ISR, the first resistor R1, a second resistor R2, a current mirror (including a first transistor T1 and a second transistor T2), a third resistor R3, a third transistor T3, a third capacitor C3, an operational amplifier OPA, and a fourth transistor T4.

The first terminal of the second capacitor C2 may be connected to the reference current source ISR. The second terminal of the second capacitor C2 is grounded. The reference current source ISR is configured to provide the reference current Ic to the second capacitor C2 to charge the second capacitor C2 to have the target reference voltage REF.

The first terminal of the first resistor R1 may be connected to the first terminal of the second capacitor C2. The second terminal of the first resistor R1 may be connected to a first terminal of the second resistor R2. A second terminal of the second resistor R2 is grounded. A first reference potential REFB1 is at a first reference node between the first resistor R1 and the second resistor R2.

The current mirror may be connected to a common voltage source VCC, and the first reference node between the first resistor R1 and the second resistor R2. In detail, the current mirror includes a first transistor T1 and a second transistor T2. A first terminal of the first transistor T1 and a first terminal of the second transistor T2 may be connected to the common voltage source VCC. A second terminal of the first transistor T1 may be connected to the first reference node. A control terminal of the first transistor T1 may be connected to a control terminal and a second terminal of the second transistor T2. The second terminal of the second transistor T2 may be grounded through the third resistor R3.

Further, the third transistor T3 may be connected between the second transistor T2 and the third resistor R3. A first terminal of the third transistor T3 may be connected to the second terminal of the second transistor T2. A second terminal of the third transistor T3 is grounded through the third resistor R3. A control terminal of the third transistor T3 may be coupled to a first control potential. A first terminal of the third capacitor C3 may be connected to the control terminal of the third transistor T3. A second terminal of the third capacitor C3 is grounded. The third capacitor C3 has the first control potential.

Further, the operational amplifier OPA has a first amplification input terminal and a second amplification input terminal. The first amplification input terminal of the operational amplifier OPA may be coupled to a second reference potential REFB2. The second amplification input terminal of the operational amplifier OPA may be connected to a second node between the third transistor T3 and the third resistor R3. An output terminal of the operational amplifier OPA may be connected to the first terminal of the third capacitor C3.

The operational amplifier OPA is configured to multiply a difference between the second reference potential REFB2 and a voltage of the third resistor R3 by a gain to output an operation amplified signal to the control terminal of the third transistor T3 to control the third transistor T3. As a result, a current flowing through the third transistor T3 is adjusted such that the second comparison input terminal of the first comparator CP1 shown in FIG. 4 has the target reference voltage REF.

Further, the fourth transistor T4 may be connected between the reference current source ISR and the second capacitor C2. A first terminal of the fourth transistor T4 may be connected to the reference current source ISR. A second terminal of the fourth transistor T4 may be connected to the first terminal of the second capacitor C2. A control terminal of the fourth transistor T4 may be coupled to a second control potential. As shown in FIG. 4, the control terminal of the fourth transistor T4 may be connected to the output terminal of the mode switching circuit USM. The mode switching circuit USM outputs the mode switching signal to control the control terminal of the fourth transistor T4. The above-mentioned second control potential may be a potential of the mode switching signal.

In summary, the present disclosure provides the power converter such as a constant on-time power converter. The waveform of the current of the inductor of the power converter of the present disclosure can be converged without using the equivalent series resistor of the conventional power converter to enhance the design flexibility of the system.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A power converter having a switch circuit, a controller circuit and a driver circuit, wherein the driver circuit is connected between the controller circuit and the switch circuit, the controller circuit outputs a control signal for controlling the driver circuit to drive the switch circuit according to a first comparison signal, the switch circuit is connected to an input voltage source and an inductor, the inductor is connected in series with a first capacitor and grounded through the first capacitor, the power converter comprises:
   a first comparator having a first comparison input terminal and a second comparison input terminal, wherein the first comparison input terminal is connected to an output terminal between the inductor and the first capacitor, and the first comparator is configured to compare a voltage of the first comparison input terminal with a target reference voltage of the second comparison input terminal to output the first comparison signal to the controller circuit; and
   a reference voltage supplying circuit, including:
      a second capacitor having a first terminal connected to the second comparison input terminal of the first comparator, and having a second terminal grounded;
      a reference current source connected to the first terminal of the second capacitor, and configured to provide a reference current to the second capacitor to charge the second capacitor such that the second capacitor has the target reference voltage;
      a first resistor having a first terminal connected to the first terminal of the second capacitor, and having a second terminal coupled to a first reference level, and the first reference level is at a first reference node between the second terminal of the first resistor and a first terminal of a second resistor;
      a current mirror includes a first transistor and a second transistor, wherein a first terminal of the first transistor and a first terminal of the second transistor are connected to the common voltage source, a second terminal of the first transistor is connected to the first terminal of the second resistor, a second terminal of the second resistor is grounded, and a control terminal of the first transistor is connected to a control terminal of the second transistor and a second terminal of the second transistor;
      a third transistor, wherein a first terminal of the third transistor is connected to the second terminal of the second transistor, a second terminal of the third transistor is connected to a first terminal of a third resistor, and a second terminal of the third resistor is grounded; and
      a third capacitor, wherein a first terminal of the third capacitor is connected to a control terminal of the third transistor, and a second terminal of the third capacitor is grounded.

2. The power converter according to claim 1, further comprising:
   a voltage divider circuit connected between the output terminal and the first comparison input terminal, and configured to divide an output voltage of the output terminal to output a divided voltage to the first comparison input terminal.

3. The power converter according to claim 1, wherein the reference voltage supplying circuit further includes:
   an operational amplifier having a first amplification input terminal and a second amplification input terminal, wherein the first amplification input terminal of the operational amplifier is coupled to a second reference level, the second amplification input terminal of the operational amplifier is connected to a second node between the second terminal of the third transistor and the first terminal of the third resistor, and an output terminal of the operational amplifier is connected to the first terminal of the third capacitor.

4. The power converter according to claim 1, the reference voltage supplying circuit further includes:
   a fourth transistor connected between the reference current source and the second capacitor, wherein a first terminal of the fourth transistor is connected to the reference current source, a second terminal of the fourth transistor is connected to the first terminal of the second capacitor, and a control terminal of the fourth transistor is coupled to a second control potential.

5. The power converter according to claim 4, further comprising:
   a mode switching circuit connected to an output terminal of the first comparator and the control terminal of the fourth transistor, and configured to output a mode switching signal to the control terminal of the fourth transistor according to the first comparison signal.

6. The power converter according to claim 5, further comprising:
   a logic circuit, wherein an input terminal of the logic circuit is connected to the output terminal of the first comparator, an output terminal of the mode switching circuit and an input terminal of the controller circuit, and the logic circuit is configured to output a logic signal to the controller circuit according to the first comparison signal and the mode switching signal.

7. The power converter according to claim 6, further comprising:
   an on-time adjuster circuit connected to the logic circuit, the switch circuit and the input voltage source, and configured to receive an input voltage from the input voltage source and output an on-time signal according to an on state of the switch circuit;
   wherein the logic circuit outputs the logic signal according to the first comparison signal, the mode switching signal and the on-time signal.

8. The power converter according to claim 7, further comprising:
   a logic gate, wherein two input terminals of the logic gate are respectively connected to the output terminal of the mode switching circuit and an output terminal of the on-time adjuster circuit, and an output terminal of the logic gate is connected to the input terminal of the logic circuit.

9. The power converter according to claim 7, further comprising:
   a zero current detector circuit connected to the switch circuit, the controller circuit, the on-time adjuster circuit and the mode switching circuit, and configured to detect a current flowing through the switch circuit to output a current value;
   wherein the on-time signal, the mode switching signal and the control signal depend on the current value.

* * * * *